US012641789B2

(12) United States Patent
Li et al.

(10) Patent No.: US 12,641,789 B2
(45) Date of Patent: *May 26, 2026

(54) THREE-DIMENSIONAL NAND MEMORY DEVICE AND METHOD OF FORMING THE SAME

(71) Applicant: Yangtze Memory Technologies Co., Ltd., Wuhan (CN)

(72) Inventors: Beibei Li, Wuhan (CN); SiMin Liu, Wuhan (CN); Wei Xu, Wuhan (CN); Bin Yuan, Wuhan (CN); Bo Xu, Wuhan (CN); Yali Guo, Wuhan (CN); Zongke Xu, Wuhan (CN); Jiajia Wu, Wuhan (CN); ZongLiang Huo, Wuhan (CN); Lei Xue, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 551 days.

This patent is subject to a terminal disclaimer.

(21) Appl. No.: 18/090,872

(22) Filed: Dec. 29, 2022

(65) Prior Publication Data

US 2024/0215238 A1 Jun. 27, 2024

(30) Foreign Application Priority Data

Dec. 21, 2022 (CN) .......................... 202211651082.7

(51) Int. Cl.
*H10B 43/00* (2023.01)
*H10B 43/27* (2023.01)

(52) U.S. Cl.
CPC .................................... *H10B 43/27* (2023.02)

(58) Field of Classification Search
CPC ............................... H10B 43/10; H10B 43/27
See application file for complete search history.

(56) References Cited

U.S. PATENT DOCUMENTS

2021/0225862 A1* 7/2021 Zhang .................... H10B 43/27
2024/0215236 A1* 6/2024 Li .......................... H10B 43/27

* cited by examiner

*Primary Examiner* — Reema Patel
(74) *Attorney, Agent, or Firm* — Oblon, McClelland, Maier & Neustadt, L.L.P.

(57) ABSTRACT

A semiconductor device includes decks stacked over a semiconductor layer in a vertical direction. Each deck includes alternating word line layers and insulating layers. A gate line structure (GLS) extends through the word line layers and the insulating layers of the decks. A channel structure extends through the word line layers and the insulating layers of the decks. A sidewall of the GLS is discontinuous at a border between two neighboring decks, and a sidewall of the channel structure is discontinuous at an interface between two neighboring decks. The GLS includes a first GLS that includes a gate line slit, a second GLS that includes sub-GLSs spaced apart from each other in a horizontal direction, or a combination thereof.

20 Claims, 14 Drawing Sheets

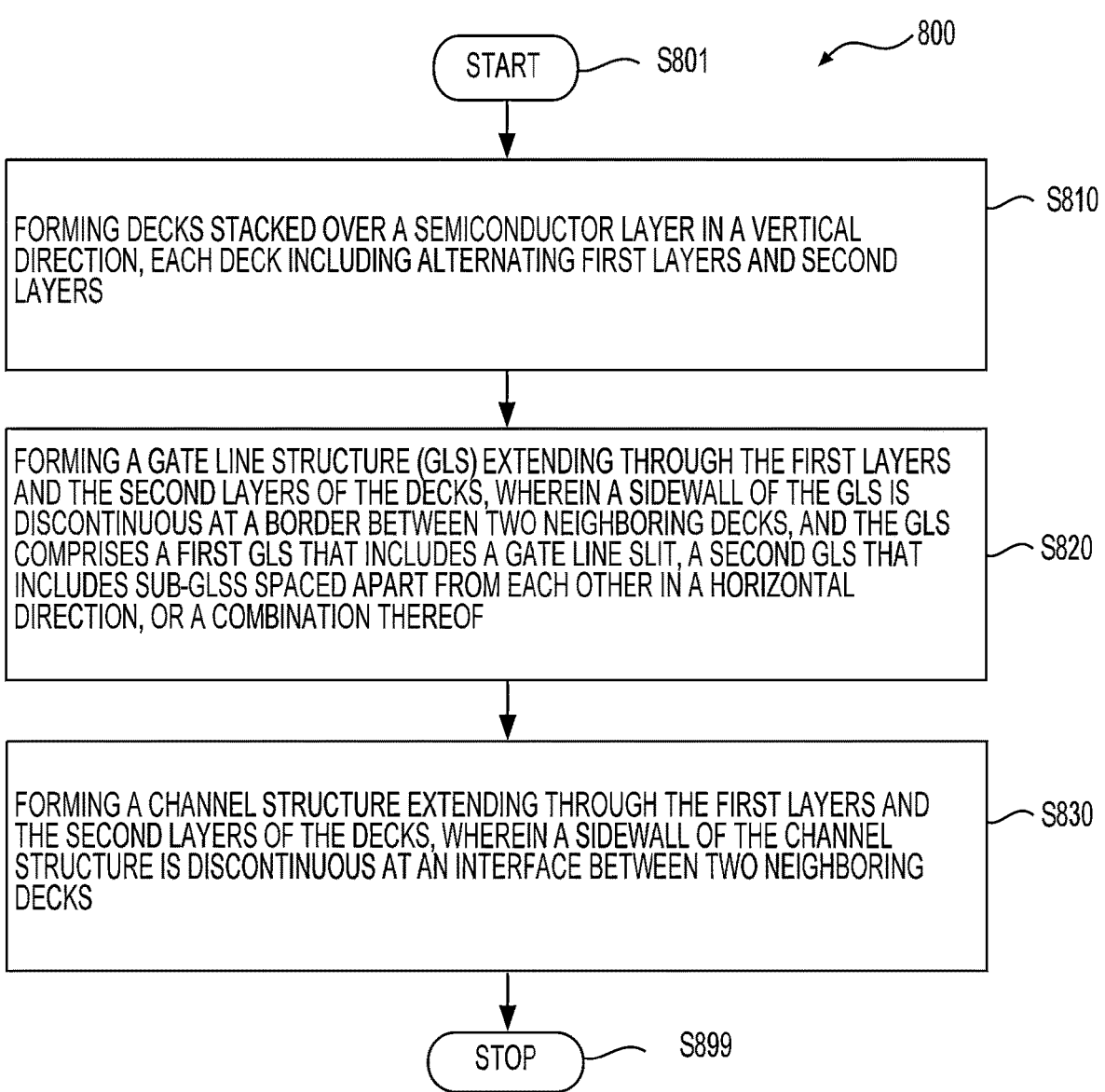

START — S801

800

FORMING DECKS STACKED OVER A SEMICONDUCTOR LAYER IN A VERTICAL DIRECTION, EACH DECK INCLUDING ALTERNATING FIRST LAYERS AND SECOND LAYERS — S810

FORMING A GATE LINE STRUCTURE (GLS) EXTENDING THROUGH THE FIRST LAYERS AND THE SECOND LAYERS OF THE DECKS, WHEREIN A SIDEWALL OF THE GLS IS DISCONTINUOUS AT A BORDER BETWEEN TWO NEIGHBORING DECKS, AND THE GLS COMPRISES A FIRST GLS THAT INCLUDES A GATE LINE SLIT, A SECOND GLS THAT INCLUDES SUB-GLSS SPACED APART FROM EACH OTHER IN A HORIZONTAL DIRECTION, OR A COMBINATION THEREOF — S820

FORMING A CHANNEL STRUCTURE EXTENDING THROUGH THE FIRST LAYERS AND THE SECOND LAYERS OF THE DECKS, WHEREIN A SIDEWALL OF THE CHANNEL STRUCTURE IS DISCONTINUOUS AT AN INTERFACE BETWEEN TWO NEIGHBORING DECKS — S830

STOP — S899

FIG. 8

THREE-DIMENSIONAL NAND MEMORY DEVICE AND METHOD OF FORMING THE SAME

CROSS-REFERENCE

This application claims the priority to Chinese Application No. 202211651082.7, filed on Dec. 21, 2022. The entire disclosure of the prior application is hereby incorporated by reference in its entirety.

BACKGROUND

As critical dimensions of devices in integrated circuits shrink to the limits of planar memory cell technologies, designers have been looking to techniques for stacking multiple planes of memory cells to achieve a greater storage capacity and a lower cost per bit. A three-dimensional (3D) NAND memory device can include a stack of alternating insulating layers and word line layers over a substrate or a semiconductor layer. Memory cell strings can be formed along a channel structure extending through the stack of alternating insulating layers and word line layers.

SUMMARY

Aspects of the disclosure provide a semiconductor device. The semiconductor device includes decks stacked over a semiconductor layer in a vertical direction. Each deck includes alternating word line layers and insulating layers. A gate line structure (GLS) extends through the word line layers and the insulating layers of the decks. A channel structure extends through the word line layers and the insulating layers of the decks. A sidewall of the GLS is discontinuous at a border between two neighboring decks, and a sidewall of the channel structure is discontinuous at an interface between two neighboring decks. The GLS includes a first GLS that includes a gate line slit, a second GLS that includes sub-GLSs spaced apart from each other in a horizontal direction, or a combination thereof.

In some embodiments, the GLS includes a first portion extending through a first deck, and a second portion extending through a second deck. A top surface of the first portion of the GLS is in direct contact with and positioned within a bottom surface of the second portion of the GLS. In one embodiment, a sidewall of the first portion of the GLS is spaced apart from a sidewall of the second portion of the GLS. In one embodiment, a sidewall of the first portion of the GLS and a sidewall of the second portion of the GLS are in direct contact with each other.

In some embodiments, the channel structure includes a first portion extending through a first deck, and a second portion extending through a second deck. A bottom surface of the second portion of the channel structure is in direct contact with and positioned within a top surface of the first portion of the channel structure. In one embodiment, the bottom surface of the second portion of the channel structure has a smaller circumference than the top surface of the first portion of the channel structure.

In some embodiments, the GLS includes at least one gate line slit extending through one deck, and sub-GLSs extending through another deck and spaced apart from each other. The sub-GLSs are aligned with and in direct contact with the at least one gate line slit. In one embodiment, the sub-GLSs are positioned over or below the at least one gate line slit.

In some embodiments, the first GLS includes a block-partitioning GLS. The second GLS includes a finger-partitioning GLS. The block-partitioning GLS includes a gate line slit with no gate line hole. In one embodiment, the finger-partitioning GLS includes gate line holes.

Aspects of the disclosure provide a method of manufacturing a semiconductor device. The method can include forming decks stacked over a semiconductor layer in a vertical direction. Each deck includes alternating first layers and second layers. A gate line structure (GLS), which extends through the first layers and the second layers of the decks, is formed. A sidewall of the GLS is discontinuous at a border between two neighboring decks. The GLS includes a first GLS that includes a gate line slit, a second GLS that includes sub-GLSs spaced apart from each other in a horizontal direction, or a combination thereof. A channel structure, which extends through the first layers and the second layers of the decks, is formed. A sidewall of the channel structure is discontinuous at an interface between two neighboring decks.

In some embodiments, the forming the decks includes forming a first deck over the semiconductor layer. A first channel opening and a first GLS opening are formed in the first deck by a first etching process. The first channel opening and the first GLS opening are formed with sacrificial material. In one embodiment, a second deck is formed over the first deck. A second channel opening and a second GLS opening are formed in the second deck by a second etching process. The second channel opening and the second GLS opening are filled with sacrificial material. In one embodiment, a bottom surface of the second channel opening is in direct contact with and positioned within a top surface of the first channel opening. A top surface of the first GLS opening is in direct contact with and positioned within a bottom surface of the second GLS opening. In one embodiment, the bottom surface of the second portion of the channel structure has a smaller circumference than the top surface of the first portion of the channel structure.

In some embodiments, the forming the decks includes forming an uppermost deck of the decks over other decks of the decks. An uppermost channel opening and an uppermost GLS opening are formed in the uppermost deck by two separate etching processes. In one embodiment, the forming the GLS includes removing sacrificial material from other GLS openings in other decks after the uppermost GLS opening is formed. The other GLS openings and the uppermost GLS opening are filled with the GLS. In one embodiment, the forming the channel structure includes removing sacrificial material from other channel openings in other decks after the uppermost channel opening is formed. The other channel openings and the uppermost channel opening are filed with the channel structure.

In some embodiments, the forming the GLS includes forming one GLS opening including holes and another GLS opening including a line slit. The holes are aligned with and in direct contact with the line slit. The holes and the line slit are filled with the GLS.

Aspects of the disclosure provide a memory system. The memory system can include a controller, interface circuitry for connecting the controller to a host device, and a memory device connected to the controller. The memory device can include decks stacked over a semiconductor layer in a vertical direction. Each deck includes alternating word line layers and insulating layers. A gate line structure (GLS) extends through the word line layers and the insulating layers of the decks. A channel structure extends through the word line layers and the insulating layers of the decks. A sidewall of the GLS is discontinuous at a border between two neighboring decks, and a sidewall of the channel structure is discontinuous at an interface between two neighboring decks. The GLS includes a first GLS that includes a gate line slit, a second GLS that includes sub-GLSs spaced apart from each other in a horizontal direction, or a combination thereof.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. The dimensions of the various features may be increased or reduced for clarity of discussion.

FIGS. 1D-1, 1D-2 and 1D-3 show cross-sectional views of the 3D NAND memory device according to embodiments of the disclosure.

FIGS. 1E-1, 1E-2 and 1E-3 show cross-sectional views of the 3D NAND memory device according to embodiments of the disclosure.

FIGS. 1F-1, 1F-2 and 1F-3 show cross-sectional views of the 3D NAND memory device according to embodiments of the disclosure.

FIGS. 2-7 are cross-sectional views of a 3D NAND memory device at various intermediate steps during manufacturing according to embodiments of the disclosure.

FIG. 8 is a flowchart of a fabrication process 800 for making a 3D NAND memory device according to embodiments of the disclosure.

DETAILED DESCRIPTION

Figure 1A:
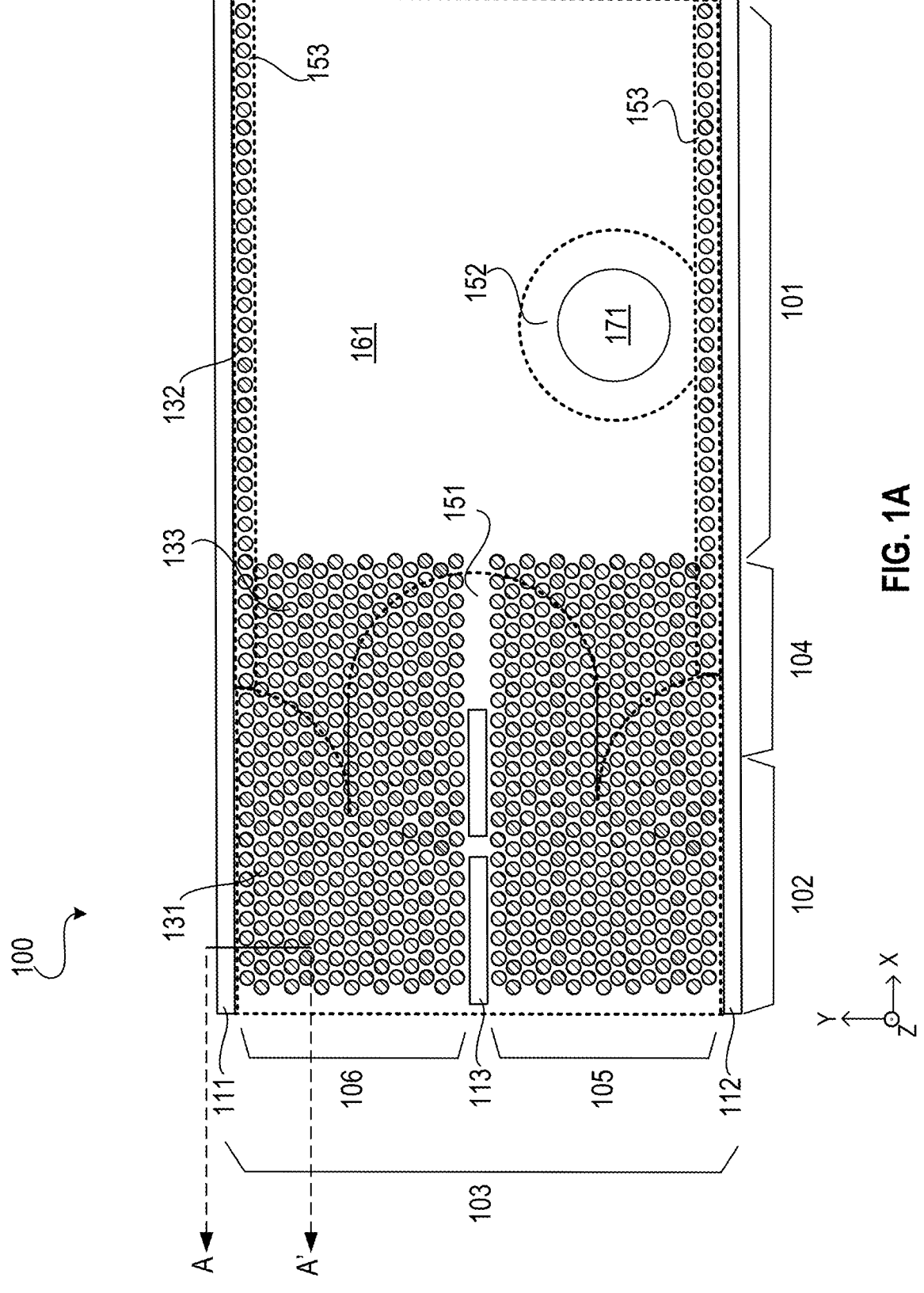
FIG. 1A shows a cross-sectional view of a 3D NAND memory device according to some embodiments of the disclosure.

The following disclosure provides many different embodiments, or examples, for implementing various features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A three-dimensional (3D) NAND memory device includes stacked word line layers for controlling vertically arranged memory cells. The number of word line layers can increase from dozens of layers to hundreds of layers to achieve a higher bit density. Accordingly, forming a gate line slit (GLS) passing the whole stacking layers by a single etch process (one-etch GLS method) becomes more and more challenging. For example, the bottom of a GLS may not be fully opened. A GLS may twist along the X direction. A vertical profile of a GLS may show notched (sometimes known as "mouse bite") or tilt sidewalls.

The present disclosure describes techniques for solving the above-mentioned problems during a fabrication process. 3D NAND memory devices with many stacking layers (e.g., more than one hundred layers) can employ a multi-deck configuration (or N-deck configuration) where channel structures are formed deck by deck. GLSs can be formed deck by deck (multi-etch GLS method). In this way, forming a single GLS through the whole stacking layers in a single etch process can be replaced with separately forming multiple sub-GLSs each through a deck of stacking layers. The etch process becomes easier and the shapes of the GLSs become more controllable due to the reduced individual deck depth.

In some embodiments, formation of the GLSs and the channel structures in a deck can be merged to save processing costs. For example, the construction of the GLSs and the channel structures can share a same lithography mask and use a same etch process. In some embodiments, formation of the GLSs and the channel structures in a deck can be done using different etch processes, for example, when the GLSs and the channel structures may cross different layers of materials.

FIG. 1A shows a cross-sectional view of a block 103 of a 3D NAND memory device 100 (hereinafter referred to as a device 100) according to some embodiments of the disclosure. A 3D coordinate system is used in FIG. 1A and other figures in the present disclosure as a reference for describing the structures of the device 100. The 3D coordinate system has three mutually perpendicular coordinate axes: the x-axis, the y-axis, and the z-axis corresponding to an X direction, a Y direction, and a Z direction, respectively.

The block 103 is bounded by two gate line structures (GLSs) 111-112 (also referred to as block-partition GLSs or first GLSs). The block-partition GLSs 111-112 extend in the X direction in the top view of FIG. 1A. The device 100 includes alternating word line layers and insulating layers (not shown) that extend in parallel with an X-Y plane and stack in the Z direction. The block-partition GLSs 111-112 can each extend in an X-Z plane and cut through the stacking layers to define the block 103. The device 100 can be partitioned by any number of block-partition GLSs each extending in a respective X-Z plane, resulting in any number of blocks. The block 103 can be one of these blocks.

The block 103 further includes a sequence of GLSs 113 (referred to as finger-partition GLSs). The sequence of finger-partition GLSs 113 is distributed along the X direction in the top view of FIG. 1A. Each finger-partition GLS cuts through the stacking layers in the Z direction. Consequently, the block 103 is partitioned into two fingers 105-106. In various embodiments, the block 103 can include any number of finger-partition GLS sequences. Each finger-partition GLS sequence can include any number of GLSs. In some examples, a sequence of finger-partition GLSs can cross a block from the left side to the right side in the X direction.

The block 103 includes several regions: a contact region 101, a storage region 102, and a transition region 104 between the contact region 101 and the storage region 102, as shown in FIG. 1A. The storage region 102 (also referred to as a core region or an array region) includes channel structures 131. The channel structures 131 are vertically (in the Z direction) formed and cross the stacking word line layers. A memory cell transistor is formed at each position where a channel structure crosses a word line layer. A memory cell string is thus formed along each channel structure in the Z direction. The transition region 104 includes dummy channel structures 133. The contact region 101 includes dummy channel structures 132.

The contact region 101 includes vertically (in the Z direction) formed word line contacts 171. Each word line contact 171 can reach a respective word line layer (referred to as a target word line layer for a specific word line contact) at the bottom of the word line contact. While one word line contact 171 is shown in FIG. 1A, there can be any number of word line contacts formed in the contact region to provide a contact line to respective word line layers.

In the FIG. 1A example, each word line layer can extend in an X-Y plane to cover the three regions 101/104/102 in the block 103. No staircase structures are formed in the block 103.

Each word line layer can include different areas that may include different materials, be formed by different processes, and serve for different purposes. A layout of a particular word line layer (referred to as a first word line layer below) is shown in FIG. 1A as an example. As shown, the first word line layer can include areas 151/152/153/161 (also can be referred to as portions, regions, or layers). For example, a stack of alternating sacrificial layers and insulating layers can be formed at that early stage. Each sacrificial layer can later be partially replaced with a layer of conductive material and become a word line layer, such as the first word line layer. In the first word line layer, the areas 151/152/153 can be portions where the sacrificial layer has been replaced with a conductive material. The area 161 can be a portion where the original sacrificial layer remains. The area 161 can be considered as and referred to as a sacrificial area 161 or a sacrificial layer 161 within the first word line layer.

The (conductive) area 153 of the first word line layer provides a connection (via the area 152) between the word line contact 171 and the area 151. The (conductive) area 152 provides a connection between the word line contact 171 and the area 153. The (conductive) area 151 serves as a gate electrode and is in connection with memory cells in the first word line layer. In this manner, the memory cells can be connected with respective word lines formed on top of the device 100.

For different word line layers in the block 103, the word line contacts can be distributed at different locations seen from the top view. Accordingly, a conductive region (similar to the area 152) near each word line contact can have different locations in the respective target word line layer seen from the top view. Each word line contact can extend from the respective target word line layer upwards (along the Z direction) to connect to a word line disposed on top of the block 103. Each word line contact can cross the word line layers above the target word line layer to reach the respective word line. The position for a word line contact to cross a word line layer can be within a sacrificial layer (an area similar to the sacrificial layer 161 (area 161) in the first word line layer) of this word line layer the word line contact crossed.

In the transition region 104, as shown in FIG. 1A, the first word line layer (and other word line layers in the block 103) transitions from the (conductive) area 151 to the sacrificial area 161. In some examples, this transition may introduce mechanical stress in the transition region 104. Thus, channel structures may be damaged and can not function properly.

In other examples, different from the FIG. 1A example, staircase structures are used in the contact region 101 in the device 100. In such a configuration, the contact region 101 can be referred to as a staircase region 101. For example, the staircase region 101 includes a staircase structure (not shown). The staircase structure includes a sequence(s) of steps formed by edges of respective word line layers. The steps go down the X direction for example. Word line contacts and dummy channels can be formed in the staircase region 101. The word line contacts can be in contact with each respective word line layer at the respective step. The dummy channels can cross the stacking layers to provide support to the structure of the device 100.

Figure 1B:
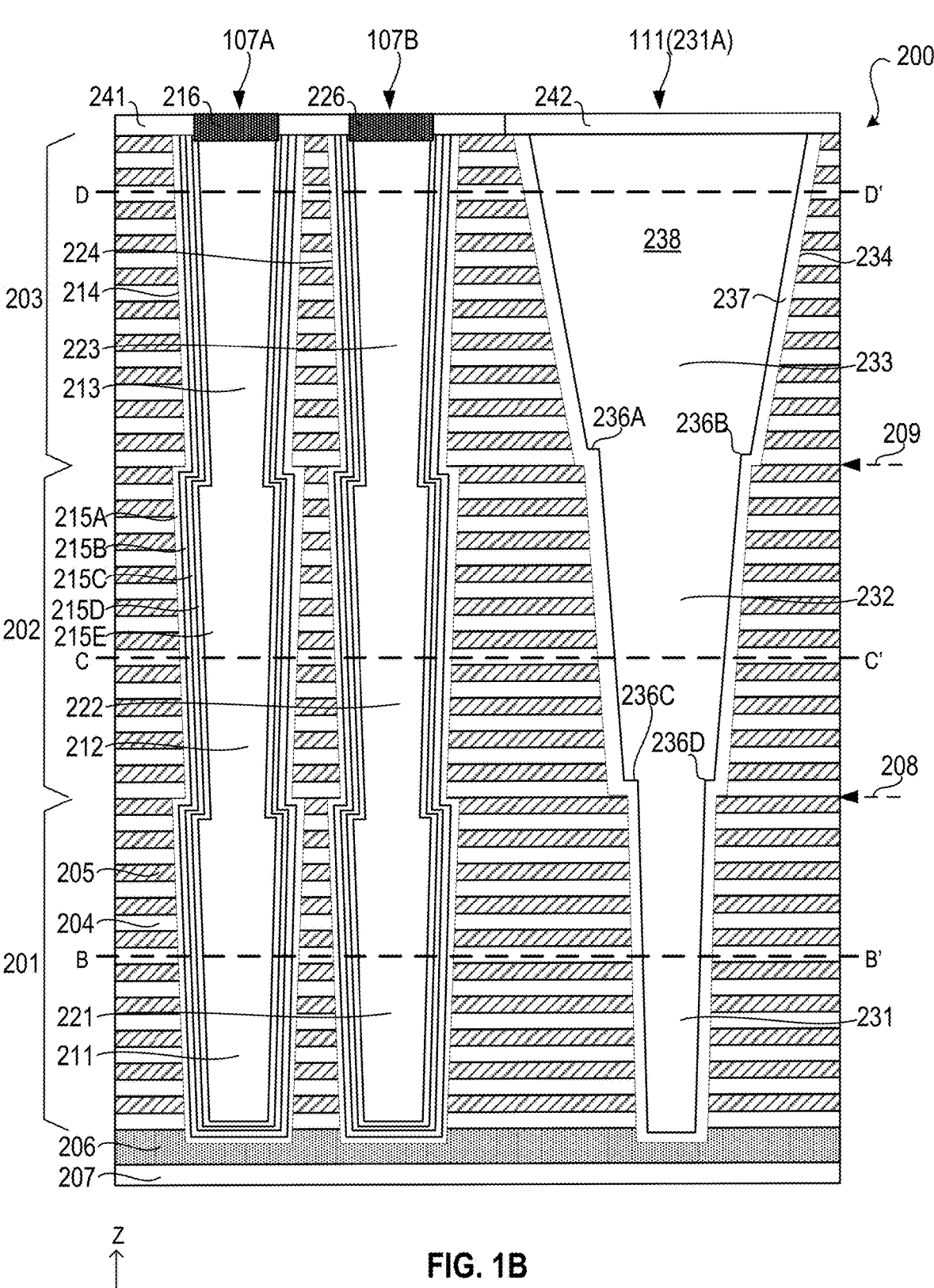
FIG. 1B shows a cross-sectional view (or a cross-section) of the 3D NAND memory device according to embodiments of the disclosure.

FIG. 1B shows a cross-sectional view (or a cross-section) 200 of the block 103 of the device 100 according to embodiments of the disclosure. The cross-sectional view 200 corresponds to a Y-Z plane passing cutline A-A' shown in FIG. 1A. The device 100 can be made using an N-deck fabrication process where N number of decks are formed deck by deck. N can be an integer greater than 1. As an example, the block 103 is shown to include three decks 201-203 stacking up in the Z direction (a vertical direction perpendicular to a working surface of a substrate 207 (also referred to as a semiconductor layer 207)).

Each deck 201-203 includes stacking layers of word line layers 204 and insulating layers 205 alternatively arranged in the Z direction. The word line layers 204 include conductive materials, such as metals, polysilicon, and the like. The insulating layers 205 include non-conductive materials. A conductive layer 206 is disposed at the bottom of the lower deck 201 and above the substrate 207. The conductive layer 206 can include a conductive material(s) and serves as a source line for the channel structures 131 in the storage region 102 shown in FIG. 1A.

Two channel structures 107A-107B are shown in the cross-sectional view 200 of FIG. 1B. Each channel structure 107A-107B includes multiple segments (sub-channel structures) connected in series in the Z direction. The channel structure 107A includes three sub-channel structures: a first-deck channel structure 211, a second-deck channel structure 212, and a third-deck channel structure 213, corresponding to the lower deck 201, the middle deck 202, and the upper deck 203, respectively. Similarly, the channel structure 107B includes three sub-channel structures or portions: a first-deck channel structure 221, a second-deck channel structure 222, and a third-deck channel structure 223, corresponding to the lower deck 201, the middle deck 202, and the upper deck 203, respectively.

As shown, the profile of a sidewall 214 or 224 of the channel structure 107A or 107B has a discontinuous shape. For example, the profile of the sidewall 214 or 224 is discontinuous at borders (also referred to as interfaces) between two adjacent or neighboring decks among the decks 201-203 (the border between the decks 201-202 and the border between the decks 202-203). In some embodiments, a bottom surface of the third-deck channel structure 223 is in direct contact with and positioned within a top surface of the second-deck channel structure 222. The bottom surface of the third-deck channel structure 223 has a smaller circumference than and is offset from the top surface of the second-deck channel structure 222 in the XY plane. Likewise, a bottom surface of the second-deck channel structure 222 is in direct contact with and positioned within a top surface of the first-deck channel structure 221. The bottom surface of the second-deck channel structure 222 has a smaller circumference than and is offset from the top surface of the first-deck channel structure 221 in the XY plane.

In an embodiment, the lower sub-channel structures 211/221 cross the stacking layers of the bottom deck 201 and reach the conductive layer 206. The middle sub-channel structures 212/222 cross the stacking layers of the middle deck 202. The upper sub-channel structures 213/223 cross the stacking layers of the upper deck 203. In an embodiment, a cap layer 241 is disposed over the top of the upper deck 203. Channel contacts 216/226 are disposed at the tops of the channel structures 107A/107B and pass through the cap layer 241.

In an embodiment, each of the channel structures 107A/107B further includes a core 215E, a channel layer 215D that surrounds the core 215E, a tunneling layer 215C that surrounds the channel layer 215D, a charge trapping layer 215B that surrounds the tunneling layer 215C, and a barrier layer 215A that surrounds the charge trapping layer 215B and further is in direct contact to the word line layers 204. In some embodiments, a high-K layer, such as HfO$_2$ or AlO, can be disposed between the word line layers 204 and the barrier layer 215A. Those layers 215A, 215B, 215C, and 215D and a corresponding word line layer together form a structure of a memory cell in a respective memory cell string.

In some embodiments, one or more top gate selection (TGS) transistors can be formed at the top word line layers of the upper deck 203 at each channel structure 107A/107B; and one or more bottom gate selection (BGS) transistors can be formed at the bottom word line layers of the bottom deck 201 at each channel structure 107A/107B. In some examples, for those TGS transistors or BGS transistors, the barrier layer 215A, the charge trapping layer 215B, and the tunneling layer 215C in a memory cell transistor may be replaced with, for example, a gate oxide layer.

The GLS 111 is shown in the cross-sectional view 200 in FIG. 1B. The GLS 111 cuts through the staking layers of the three decks 201-203 in an X-Z plane. In the cross-sectional view 200, the GLS 111 includes three segments or portions (referred to as per-deck GLS or sub-GLSs) 231-233: a bottom-deck sub-GLS 231, a middle-deck sub-GLS 232, and an upper-deck sub-GLS 233, corresponding to the decks 201-203, respectively. The bottom-deck sub-GLS 231 crosses the stacking layers of the bottom deck 201 and reaches the conductive layer 206. The middle-deck sub-GLS 232 crosses the stacking layers of the middle deck 202. The upper-deck sub-GLS 233 crosses the stacking layers of the upper deck 203 and is covered by a cap layer 242. The three sub-GLSs 231-233 are connected in series in the Z direction.

In the N-deck fabrication process, the sub-GLSs 231-233 can be formed one deck by one deck using separate etching processes at different stages of the fabrication process. As a result, a profile of a sidewall 234 of the GLS 111 in the cross-sectional view 200 has a discontinuous shape. For example, the sidewall 234 is discontinuous at positions 236A-236B located at a deck boundary (or border, or interface) 209 between the upper deck 203 and the middle deck 202 and positions 236C and 236D located at a deck boundary 208 between the middle deck 202 and the lower deck 201. In other words, the sidewall 234 includes segments staggered relative to each other instead of forming a continuous straight line in a YZ cross-section.

For the GLS 111, each sub-GLS 231/232/233 can have a wider top width and a narrower bottom width. In addition, a bottom width of an upper sub-GLS can be broader than or equal to a top width of an adjacent lower sub-GLS. Also, an upper sub-GLS can have a relatively smaller sidewall slope than a lower adjacent sub-GLS. As a result, the GLS 111, as a whole, can have a small B/T ratio (that is a ratio of the bottom width to the top width). Such a GLS shape makes it easier to fill the GLS 111 and makes the GLS 111 a stronger support structure to counter the adverse effects of mechanical stress inside the device 100.

In some examples, the GLS 111 does not provide a circuit path from the top side (front side) to the bottom side (back side) and thus can be isolated from surrounding structures or materials. In an example, a layer 237 of dielectric material (e.g., SiO2) can be formed on the sidewalls and the bottom of the GLS 111. Polysilicon 238 can then be filled in the spaces within the GLS 111. In some examples, the GLS 111 provides a circuit path for connection to the conductive layer 206. An isolation layer can be formed on the sidewalls of the GLS 111, and a conductive material (e.g., a metal) can be filled in the spaces within the GLS 111.

It is noted that the sequence of the finger-partition GLSs 113 in FIG. 1A can have a similar structure to the block-partition GLS 111. Also, the finger-partition GLSs can be formed using processing processes similar to those for making the block-partition GLS 111.

In various embodiments, the device 100 can include any number of decks, such as 2, 4, 5, 6, 7 or the like. Accordingly, the channel structures 107A/107B and the GLS 111 can include any number of segments corresponding to respective decks. In addition, due to different designs and fabrication processes taken, the profiles of the GLS 111 or the channel structures 107A/107B can have different shapes than the profiles shown in FIG. 1B.

In some embodiments, a segment of the channel structures 107A/107B or the GLS 111 may be formed using a single etch process but crossing more than one decks (such as 2, 3, or more decks). Those segments included in one channel structure or one GLS can each cross different number of decks. Those segments with different depths (measured by a number of decks) can be arranged in any order in different examples.

As an example, a fabrication process for making the device 100 is described below with reference to FIGS. 2-7. The FIGS. 2-7 each show a cross-sectional view of the block 103 at an intermediate stage of the fabrication process. The cross-sectional views correspond to a cut plane passing the cut line A-A' in FIG. 1A.

In some embodiments, FIGS. 1C-1, 1C-2 and 1C-3 show cross-sectional views of the device 100 taken along the line cuts BB', CC' and DD' respectively. Note that FIGS. 1C-1, 1C-2, 1C-3, 1D-1, 1D-2, 1D-3, 1E-1, 1E-2, 1E-3, 1F-1, 1F-2 and 1F-3 are not drawn to scale. As shown, channel structures 107 and dummy channel structures 134 are disposed between the block-partition GLSs 111 and 112. GLSs 114 and 115 (also referred to as finger-partition GLSs or second GLSs) are also disposed between the block-partition GLSs 111 and 112. In the examples of FIGS. 1C-1, 1C-2 and 1C-3, the bottom-deck sub-GLS 231, the middle-deck sub-GLS 232, and the upper-deck sub-GLS 233 each include gate line holes. Each gate line hole of the middle-deck sub-GLS 232 is aligned with and connected to a respective gate line hole of the bottom-deck sub-GLS 231 and a respective gate line hole of the upper-deck sub-GLS 233. The GLSs 111 and 112 are each a gate line slit.

Particularly, FIG. 1B can be a cross-sectional view taken along the line cut EE' in this example. Note that the GLS 111 shows a gate line slit while the GLS 231A shows a gate line hole. The GLS 111 and the GLS 231A may have substantially similar or the same cross sections, for example as shown in FIG. 1B.

In some embodiments, a top surface of the bottom-deck sub-GLS 231 is in direct contact with and positioned within a bottom surface of the middle-deck sub-GLS 232. A sidewall of the bottom-deck sub-GLS 231 is spaced apart from a sidewall of the middle-deck sub-GLS 232. Likewise, a top surface of the middle-deck sub-GLS 232 is in direct contact with and positioned within a bottom surface of the upper-deck sub-GLS 233. A sidewall of the middle-deck sub-GLS 232 is spaced apart from a sidewall of the upper-deck sub-GLS 233.

In some embodiments, FIGS. 1D-1, 1D-2 and 1D-3 show cross-sectional views of the device 100 taken along the line cuts BB', CC' and DD' respectively. Herein, a bottom-deck sub-GLS 231D is a gate line slit. Gate line holes in the middle-deck sub-GLS 232 and the upper-deck sub-GLS 233 are aligned with the gate line slit in the bottom-deck sub-GLS 231D. Gate line holes in the middle-deck sub-GLS 232 are in direct contact with the gate line slit in the bottom-deck sub-GLS 231D. As a result, the GLS 114 includes a combination of a gate line slit and gate line holes.

In some embodiments, FIGS. 1E-1, 1E-2 and 1E-3 show cross-sectional views of the device 100 taken along the line cuts BB', CC' and DD' respectively. Herein, a middle-deck sub-GLS 232E is a gate line slit. Gate line holes in the bottom-deck sub-GLS 231 and the upper-deck sub-GLS 233 are aligned with and are in direct contact with the gate line slit in the middle-deck sub-GLS 231D.

In some embodiments, FIGS. 1F-1, 1F-2 and 1F-3 show cross-sectional views of the device 100 taken along the line cuts BB', CC' and DD' respectively. Herein, a top-deck sub-GLS 233F is a gate line slit. Gate line holes in the bottom-deck sub-GLS 231 and the middle-deck sub-GLS 232 are aligned with the gate line slit in the top-deck sub-GLS 233F. Gate line holes in the middle-deck sub-GLS 232 are in direct contact with the gate line slit in the top-deck sub-GLS 233F.

Figures 1, 1C, 2, 3:
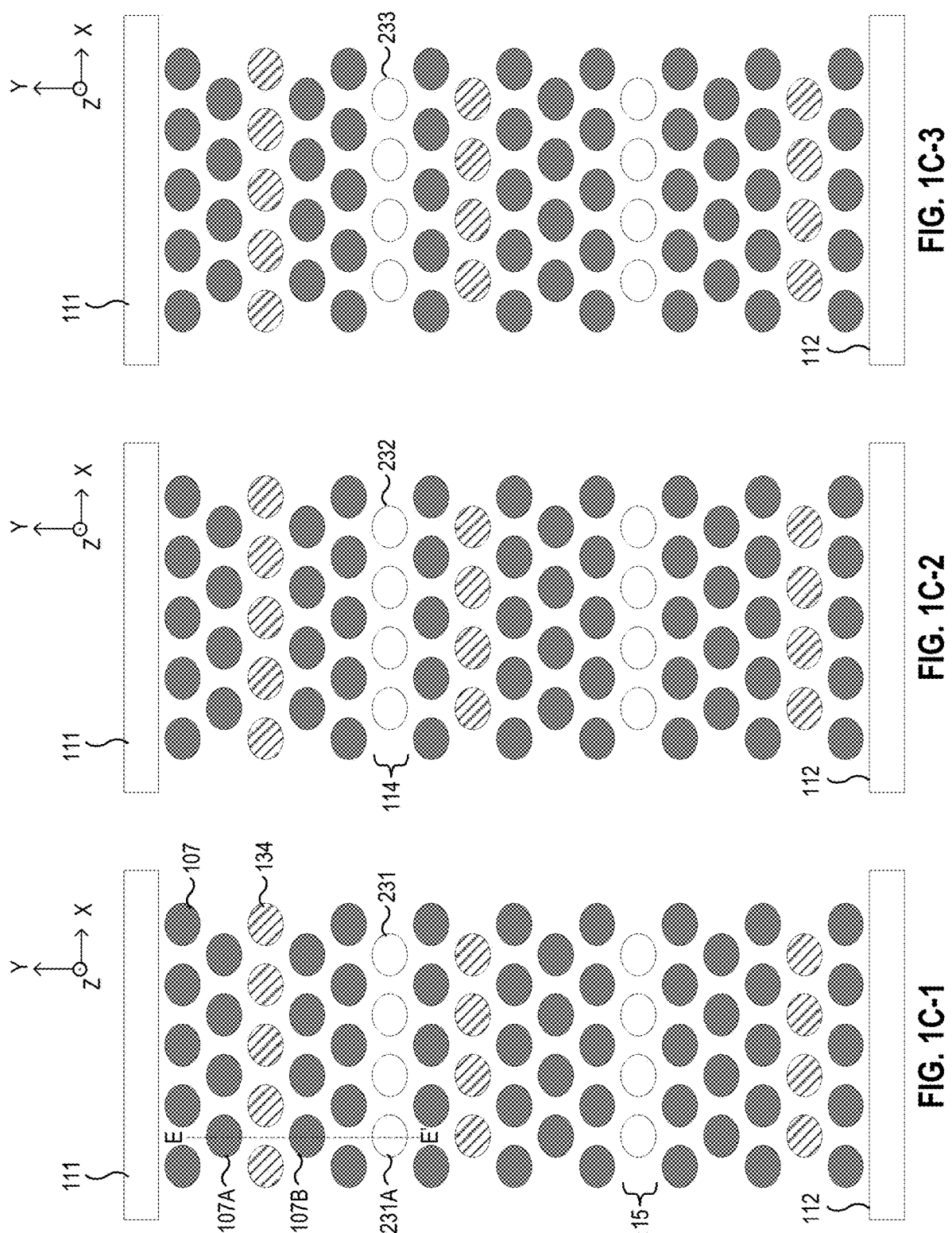
FIGS. 1C-1, 1C-2 and 1C-3 show cross-sectional views of the 3D NAND memory device according to embodiments of the disclosure.

In FIG. 2, the conductive layer 206 can be formed over the substrate 207. The substrate 207 can be any suitable substrate and can be processed to form various suitable features. The substrate 207 can be formed of any suitable semiconductor material, such as silicon (Si), germanium (Ge), SiGe, a compound semiconductor, an alloy semiconductor, and the like. The substrate 207 can include various layers, including conductive or insulating layers formed on a semiconductor substrate. The substrate 207 can include various doping configurations depending on design requirements. In some embodiments, the conductive layer 206 can be a conductive layer (e.g., polysilicon) deposited over the substrate 207. In some embodiments, the conductive layer 206 can be part of the substrate 207.

A deck 301 of stacking layers of alternating sacrificial layers 304 and insulating layer 205 is formed over the conductive layer 206. The deck 301 corresponds to the bottom deck 201 in the FIG. 1B example. In a later stage, the sacrificial layers 304 can be replaced with the word line layers 204. For example, the sacrificial layers 304 can include silicon nitride, and the insulating layers 205 can include a dielectric material, such as SiO2.

The deck 301 can include any number of stacking layers (sacrificial layers 304 and insulating layers 205), such 128, 256, or 1024 sacrificial layers. The sacrificial layers 304 and the insulating layers 205 can have any suitable thickness. The sacrificial layers 304 and the insulating layers 205 can be formed using chemical vapor deposition (CVD), physical vapor deposition (PVD), atomic layer deposition (ALD), and the like.

Channel openings 302A and 302B corresponding to the sub-channel structures 211 and 221 in FIG. 1B and a GLS opening 306 corresponding to the sub-GLS 231 can be formed simultaneously or subsequently.

It is noted that the openings 302A/302B/306 are formed in the deck 301 before a next deck is formed on top of the deck 301. In conventional methods, GLSs are formed after all decks have been formed. Due to the very large number of stacking layers of all the decks, a GLS formed in a single etch process may not cut through the stacking layers at the bottom of the stacked decks. Or, the bottom portion of a GLS may become twisted along the X direction and sidewalls of the GLS may tilt and has mouse bites. In contrast, the present disclosure provides a method for forming a multi-deck GLS in a deck-by-deck manner. The multi-deck GLS can include multiple portions (sub-GLSs) arranged vertically. Each portion is formed by etching a single deck. Due to the reduced etch depth of the sub-GLS, the shape of the vertical profile of a sub-GLS can be better controlled. As a result, the structure of the device 100 close to the GLS can be protected from being damaged because of deformation of the GLS.

In addition, in some embodiments, the openings 302A/302B/306 are formed during a same process (for example, a same etching process). Merging the formation of the openings 302A/302B/306 into one etch process can lower the manufacturing cost compared with forming the GLS opening 306 separately from the channel openings 302A/302B. In some other embodiments, the channel openings 302A/302B and the GLS opening 306 can be formed independently, for example, using two separate etching processes.

To form the openings 302A/302B/306, in an example, a mask layer (not shown) is formed over the deck 301. The mask layer is patterned using a lithography process to define locations of the openings 302A/302B/306. Based on the patterned mask layer, the openings 302A/302B/306 are formed using an etching process, such as a wet etching, a dry etching (e.g., a plasma etch referred to as a plasma punch), or a combination thereof.

Figures 1, 1D, 2, 3:
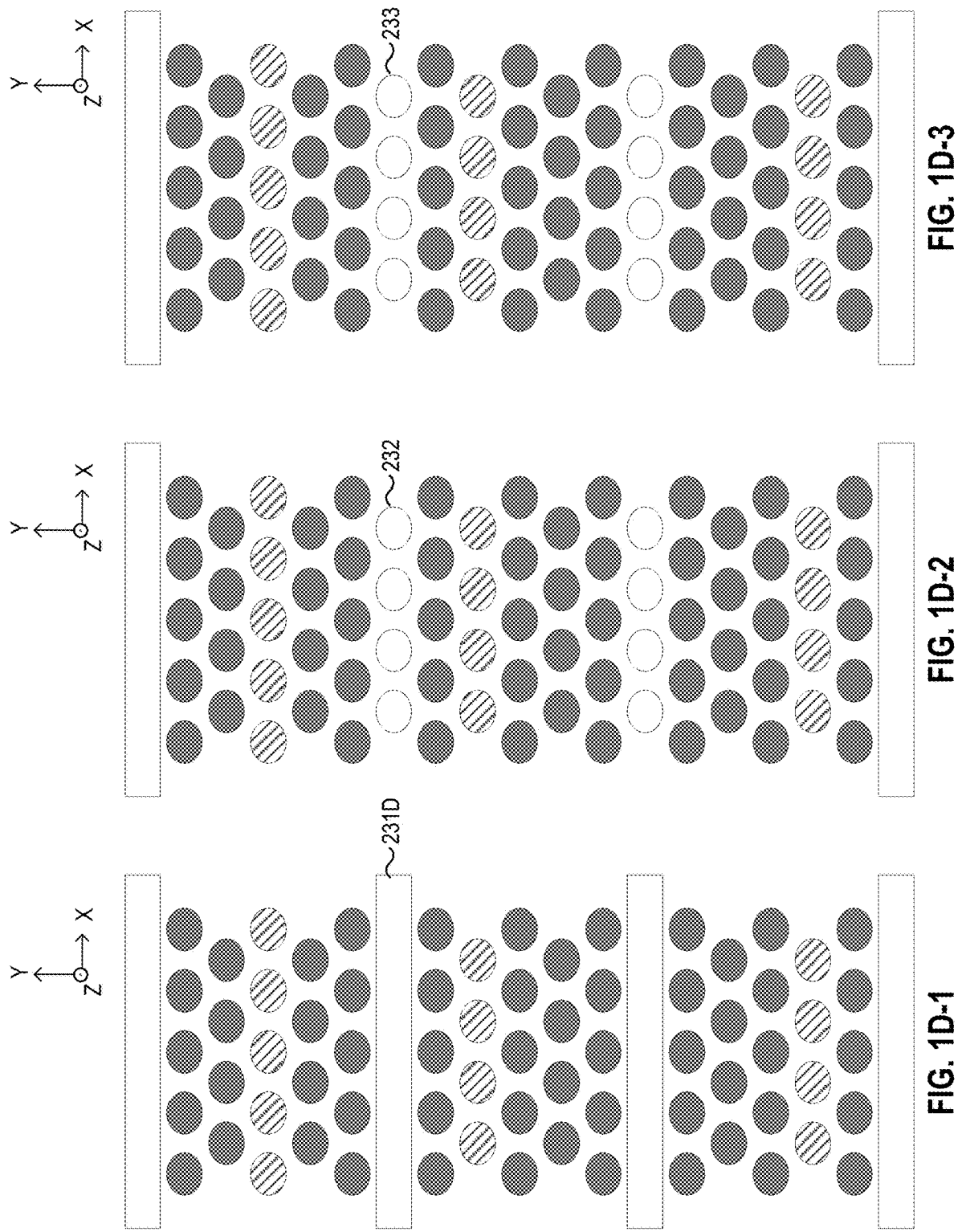

The channel openings 302A/302B can have any suitable shape, such as a circular pillar-shape, a square pillar-shape, an oval pillar-shape, and the like. The openings 302A/302B have a tapered profile where a top opening size is larger than a bottom opening size, as shown in FIG. 2. The profile of the GLS opening 306 in the cross-sectional view of FIG. 2 has a tapered profile where a top opening size (top width) is larger than a bottom opening size (bottom width), as shown in FIG. 2. In one embodiment, the GLS opening 306 is a gate line hole, and a plurality of such gate line holes are formed, for example as shown in FIG. 1C-1, 1E-1 or 1F-1. In another embodiment, the GLS opening 306 is a gate line slit, for example as shown in FIG. 1D-1.

A sacrificial layer (or core) 308 is formed to fill each of the openings 302A/302B/306. The sacrificial layer 308 can be deposited over the surface of the sidewalls of each opening 302A/302B/306. The sacrificial layer 308 can be formed using any suitable process, such as an ALD process, a CVD process, a PVD process, or a combination thereof. The sacrificial layer 308 can include one or more sacrificial materials. In various embodiments, the sacrificial layer 308 includes carbon, silicon (e.g., polysilicon), metal (e.g., tungsten), and/or the like. In an embodiment, an air void 309 is formed within the respective sacrificial layer 308.

A surface planarization process (e.g., a chemical mechanical planarization (CMP)) can be used to remove excessive materials of the mask layer and the sacrificial layer 308 from the top surface of the deck 301.

In FIG. 3, a second deck 311 is formed over the first deck 301. The second deck 311 can have structures similar to the first deck 301 and be formed in a way similar to the first deck 301. The second deck 311 can include a same number or different number of stacking layers as the first deck 301.

Channel openings 312A and 312B and a GLS opening 316 can be formed in the second deck 311 in a same processing process. A same lithography mask can be shared for the formation of the openings 302A/302B/306. The openings 312A/312B/316 can be formed in a way similar to the openings 302A/302B/306. In an embodiment, the bottoms of the openings 312A/312B/316 are positioned at the top surfaces of the sacrificial layers 308 of the openings 302A/302B/306.

A sacrificial layer 318 and an air void 319 can be formed in each of the openings 312A/312B/316 in a way similar to the sacrificial layer 308 and the air void 309 in the first deck 201.

Figures 1, 1E, 2, 3:
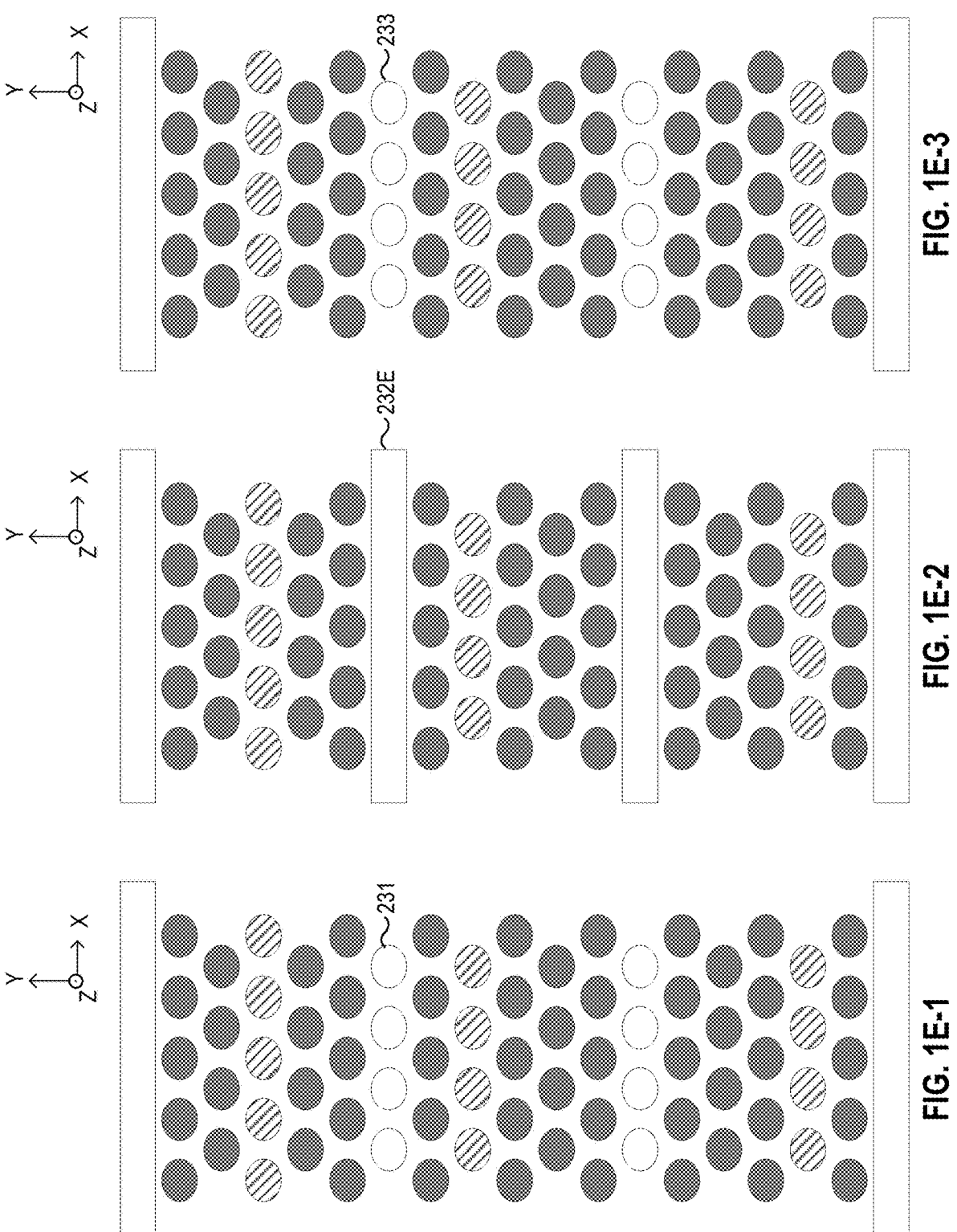

In one embodiment, the GLS opening 316 is a gate line hole, and a plurality of such gate line holes are formed, for example as shown in FIG. 1C-1, 1D-1 or 1F-1. In another embodiment, the GLS opening 316 is a gate line slit, for example as shown in FIG. 1E-1.

Figure 4:
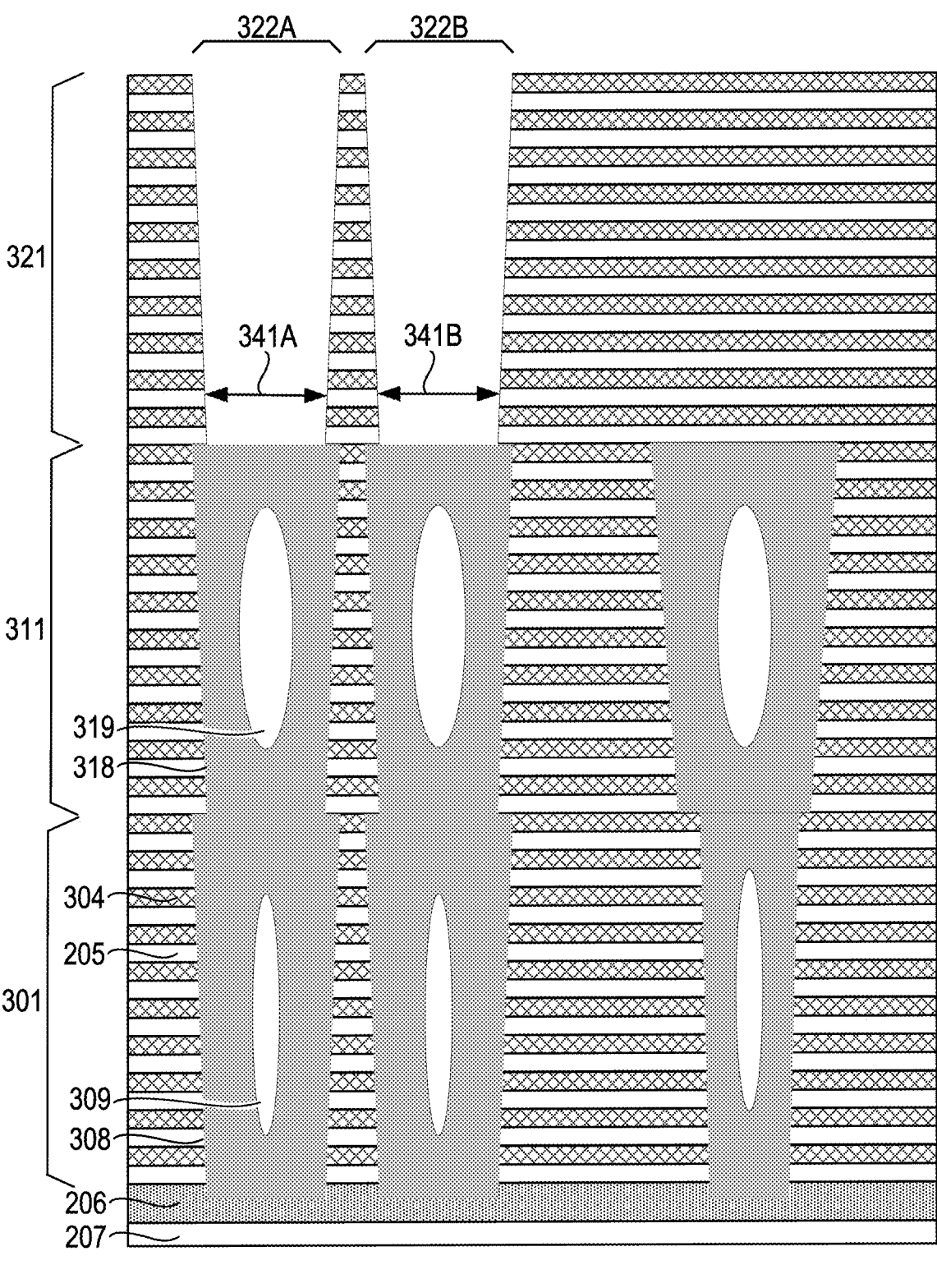

In FIG. 4, a third deck 321 is formed over the second deck 311. The third deck 321 can have structures similar to the first deck 301 and the second deck 311. The third deck 321 can be formed in a way similar to the first deck 301 and the second deck 311. The third deck 321 can include a same number or a different number of stacking layers as the first deck 301 or the second deck 311.

Channel openings 322A and 322B can be formed in the third deck 321. No GLS opening is formed at the current stage. The openings 322A/322B can be formed in a way similar to the openings 312A/312B. In an embodiment, the bottoms of the openings 322A/322B are positioned at the top surfaces of the sacrificial layers 318 in the openings 312A/312B.

By performing a suitable processing process, the sacrificial layer 318 can be removed from the openings 312A/312B (shown in FIG. 3), and the sacrificial layer 308 can be removed from the openings 302A/302B (shown in FIG. 2). In an example, the sacrificial layers 318 and 308 are formed using carbon. Dioxide gas is used to burn out the carbon to remove the sacrificial layers 318 and 308. As a result, sidewalls of the channel openings 302A/302B, 312A/312B, and 322A/322B can be exposed.

At the current stage, the channel openings 302A/302B, 312A/312B, and 322A/322B, connected in series in the Z direction, form two multi-deck channel openings: a left-side opening 341A including the channel openings 302A, 312A, and 322A, and a right-side opening 341B including the channel openings 302B, 312B, and 322B. A wet clean process can further be performed to clean the surface of the stacking layers of the decks 301/311/321 exposed in the openings 341A/341B.

Figure 5:
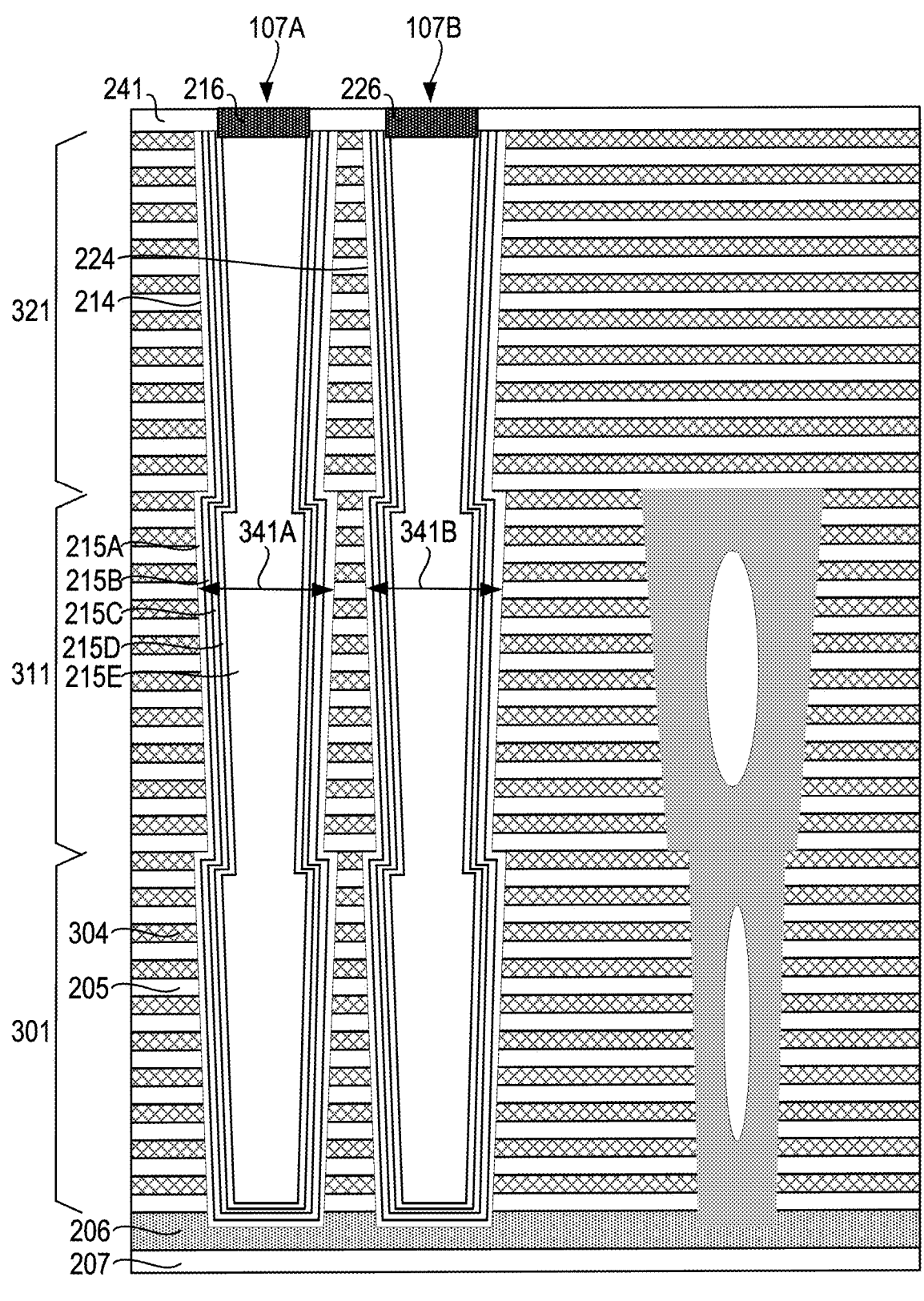

In FIG. 5, the channel structures 107A and 107B can be formed within the left-side opening 341A and the right-side opening 341B. In an embodiment, the blocking layer 215A, the charge trapping layer 215B, the tunneling layer 215C, and the channel layer 215D can be conformally and subsequently deposited over the sidewalls of the openings 341A/341B. The charge trapping layer 215B is sandwiched between the blocking layer 215A and the tunneling layer 215C. The core 215E can be formed within an opening surrounded by the channel layer 215D. A CMP process can be performed to remove the excessive materials located above the top surface of the deck 321. The cap layer 241 can be formed to cover the top surface of the deck 321. The channel contacts 216 and 226 can subsequently be formed through the cap layer 241 to connect to the channel layers 215D of the channel structures 107A/107B.

In some examples, staircase structures are employed in the contact region 101. In such a configuration, after the channel structures 107A/107B and the respective channel contacts 216/226 are formed, in some embodiments, various fabrication steps can be performed to form a staircase structure, word line contacts, and dummy channels in the staircase region 101.

In some examples, no staircase structures are used. Word line contacts (such as the word line contact 171) can be formed in the contact region. In some examples, formation of these word line contacts (without a staircase) can be postponed to a later stage when word line replacement and GLS structures have been completed.

Figure 6:
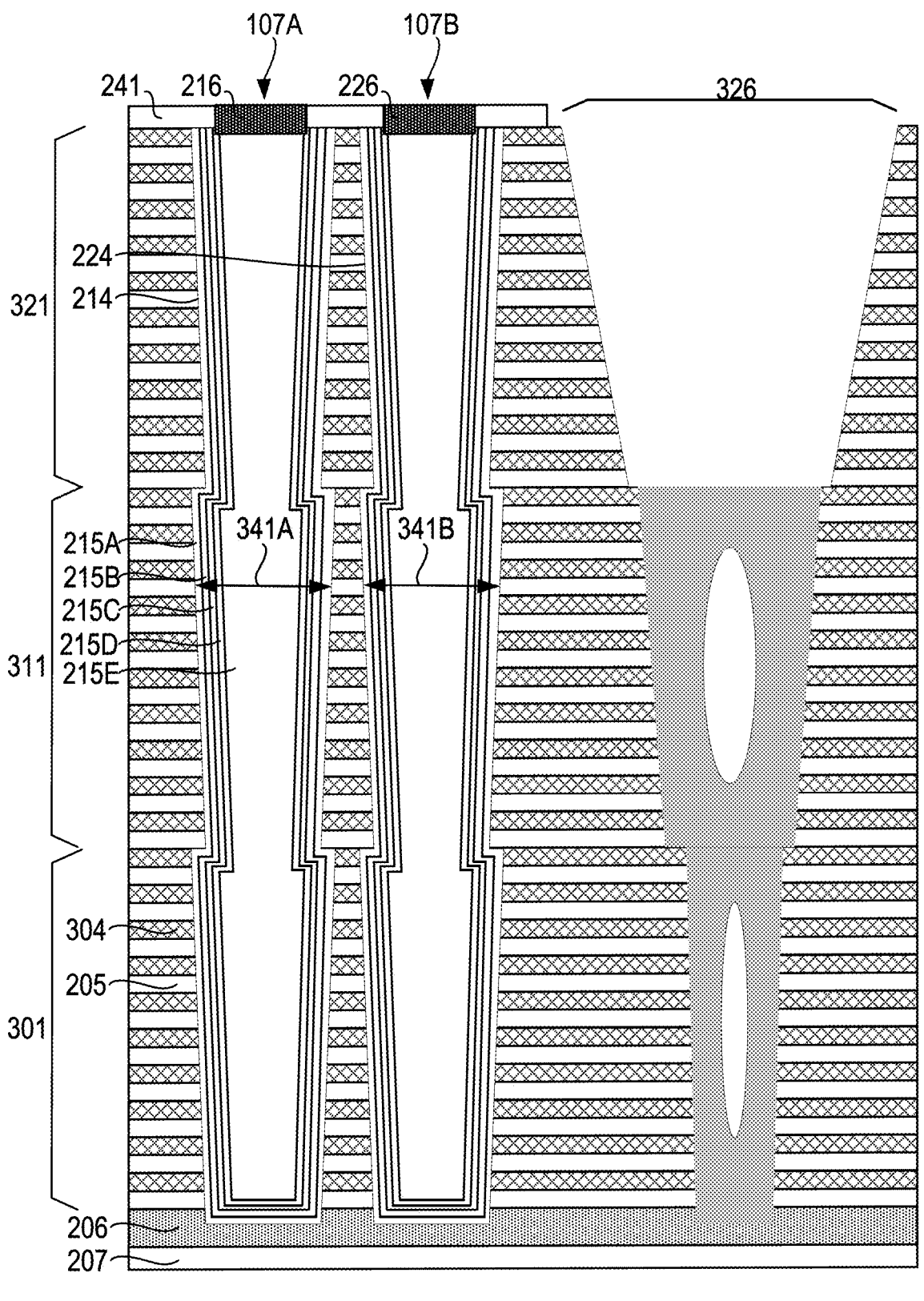

In FIG. 6, a GLS opening 326 is formed in the deck 321. The GLS opening 326 can be formed in a way similar to the opening 316 in the deck 311. In an embodiment, the bottom of the opening 326 is positioned at the top surface of the sacrificial layer 318 in the opening 316. The sacrificial layer 318 in the opening 316 (shown in FIG. 3) and the sacrificial layer 308 in the opening 306 can be removed. Sidewalls of the GLS openings 306, 316, and 326 can thus be exposed.

Figures 1, 1F, 2, 3:
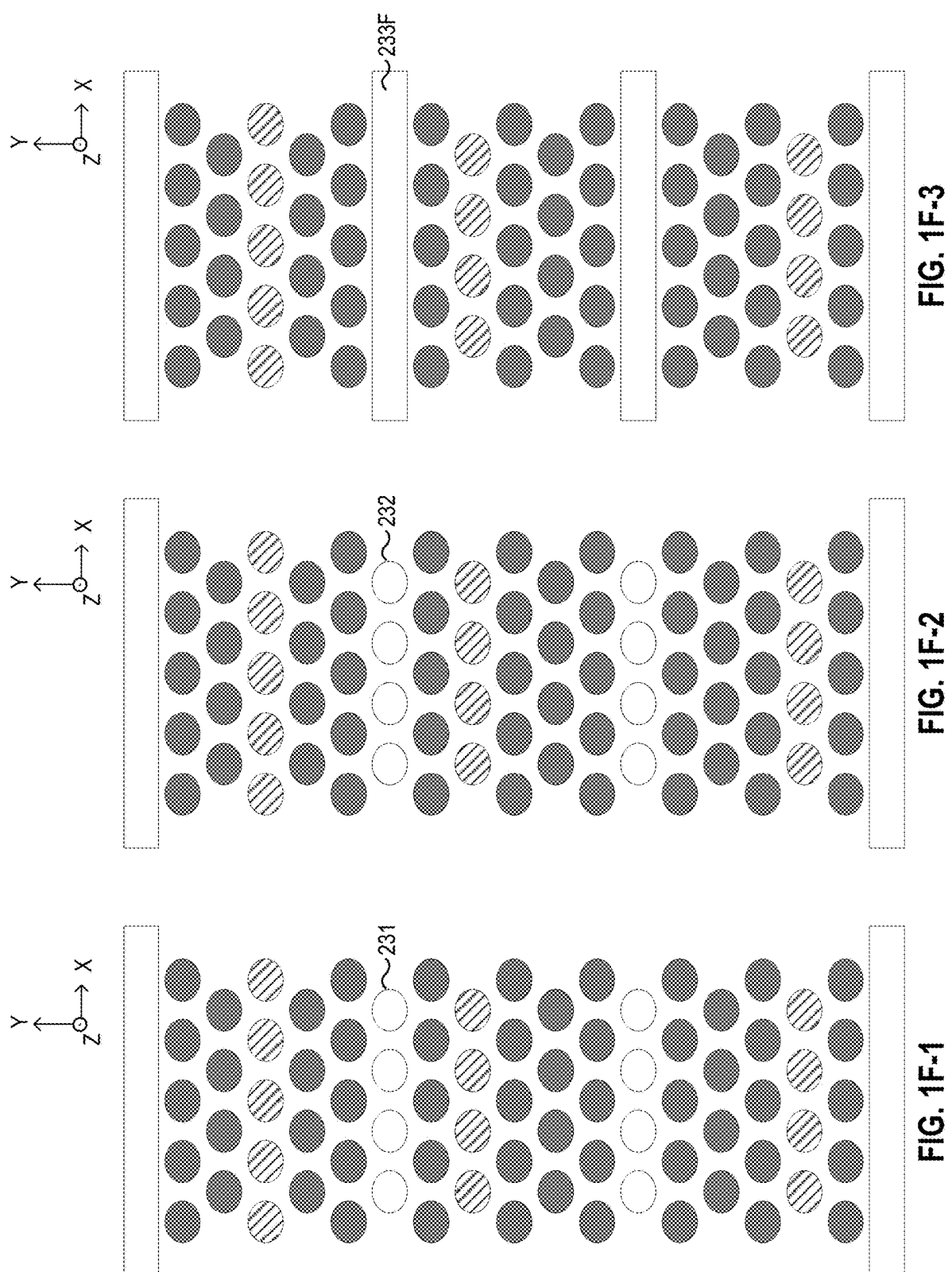
Figure 2:
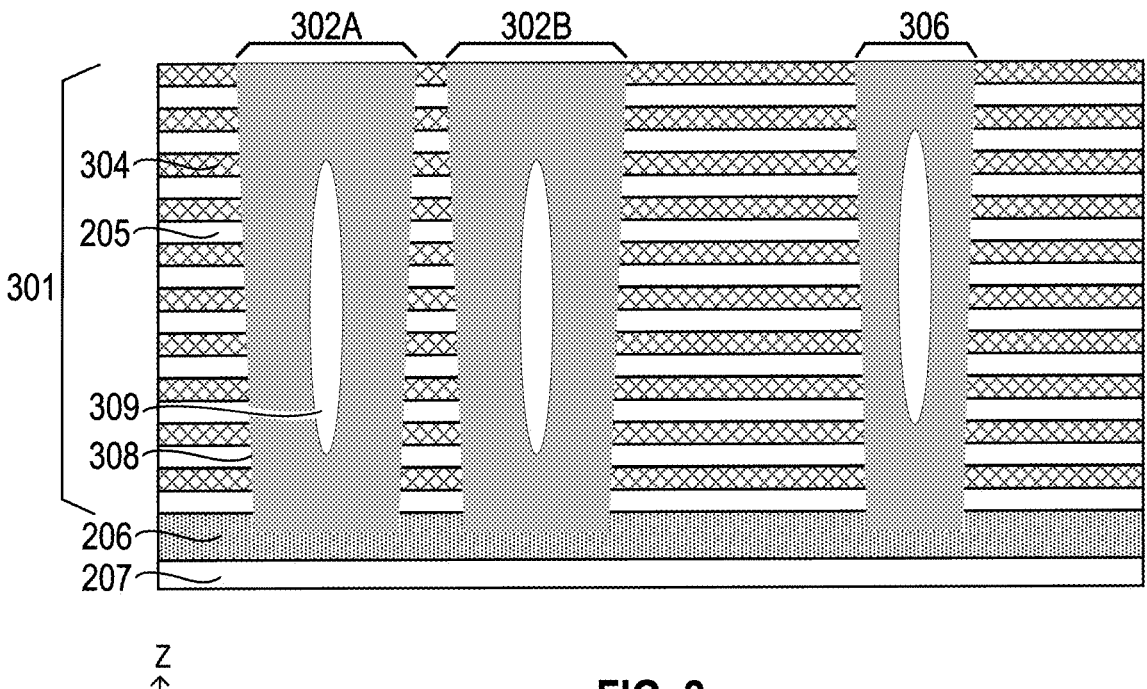
Figure 3:
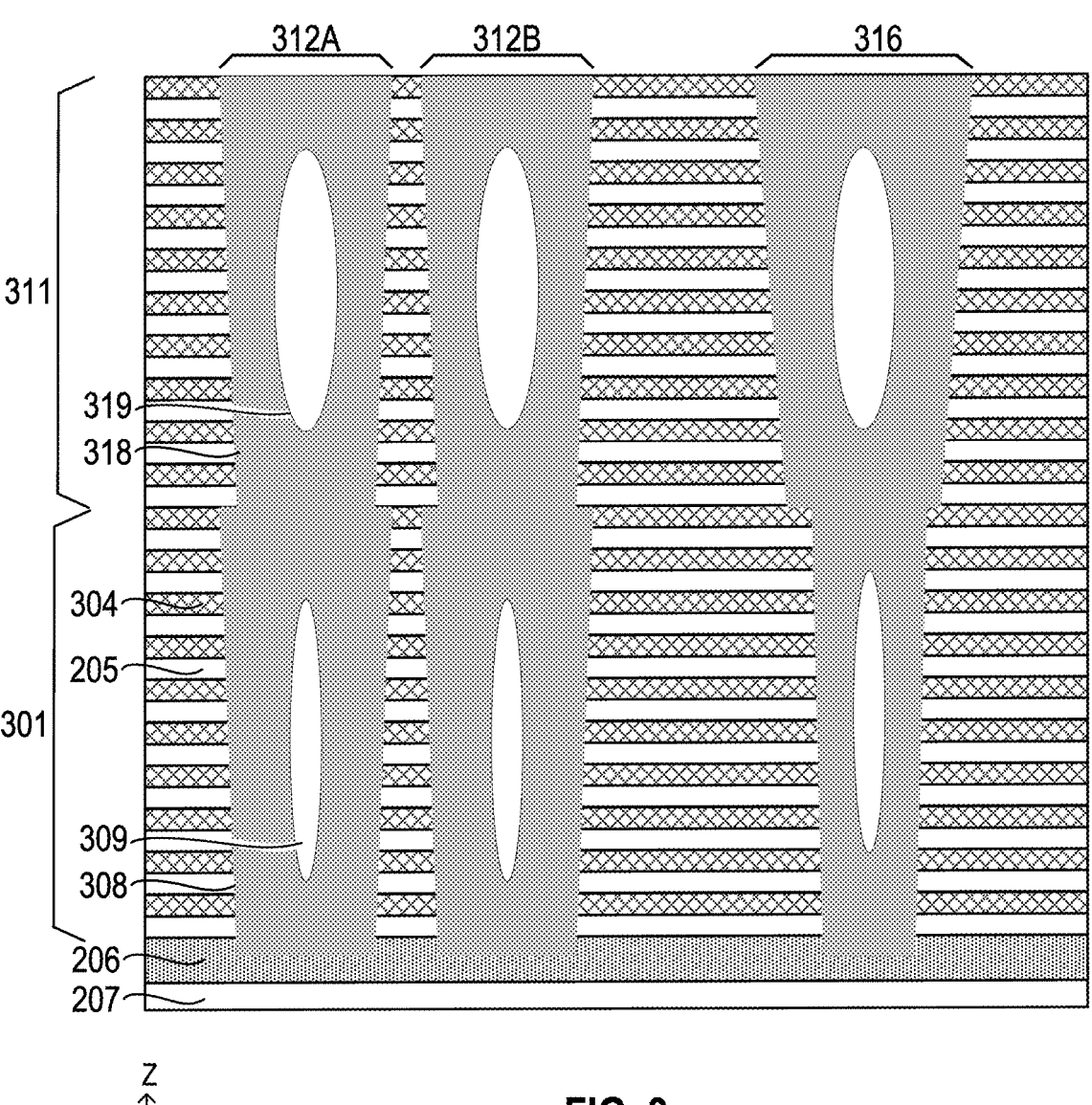

In one embodiment, the GLS opening 326 is a gate line hole, and a plurality of such gate line holes are formed, for example as shown in FIG. 1C-1, 1D-1 or 1E-1. In another embodiment, the GLS opening 316 is a gate line slit, for example as shown in FIG. 1F-1.

Figure 7:
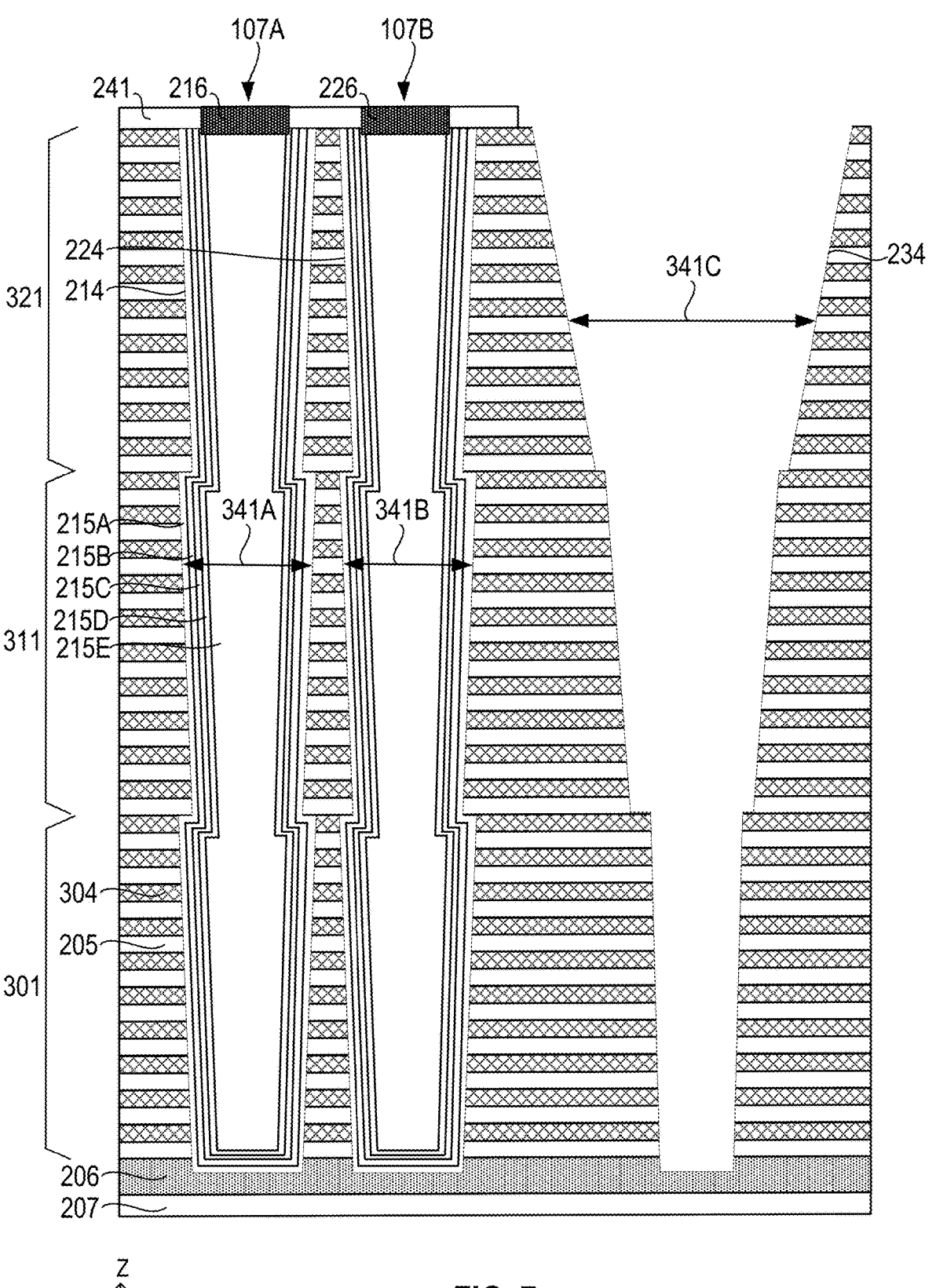

In FIG. 7, a multi-deck GLS opening 341C is shown crossing the decks 301/311/321. The multi-deck GLS opening 341C includes the GLS openings 306, 316, and 326 connected in series in the Z direction.

In subsequent steps of the fabrication process, the sacrificial layers 304 can be replaced with the word line layers 204 via the multi-deck GLS opening 341C. The multi-deck GLS opening 341C can then be closed up by filling with one or more materials. For example, the sacrificial layers 304 can be removed by an etching process, such as a wet etching process. In an example, tetramethylammonium hydroxide (TMAH) can be applied to selectively remove the sacrificial layers 304. When the sacrificial layers 304 are removed, spaces can be formed between the insulating layers 205. Sidewalls of the channel structures 107A/107B can be exposed in the spaces.

A conductive material, such as tungsten, can be deposited to fill the spaces between the insulating layers 205 to form the word line layers 204. Excessive conductive material outside the spaces between the insulating layers 205 and inside the multi-deck GLS opening 341C can be removed. In an example, a liner (e.g., TiN) can first be deposited inside the paces before filling the conductive material into the spaces.

A deposition process can be applied to deposit a dielectric material, such as $SiO_2$, along the sidewall and the bottom of the multi-deck GLS opening 341C. The GLS 111 can subsequently be formed by filling a conductive or dielectric material, such as polysilicon, into the opening inside the previously deposited dielectric material.

In the embodiments of FIGS. 4-7, the channel structures 107-107B are formed before the GLS 111 is formed. In other embodiments (not shown), the GLS 111 can be formed before the channel structures 107-107B are formed. That is, after the third deck 321 is formed, the GLS opening 326 is formed while no channel openings (e.g. 322A and 322B) are formed. Next, the sacrificial layer 318 in the opening 316 (shown in FIG. 3) and the sacrificial layer 308 in the opening 306 can be removed. Sidewalls of the GLS openings 306, 316, and 326 can thus be exposed. As a result, the multi-deck GLS opening 341C is formed so that the GLS 111 can be formed.

After forming the GLS 111, the channel openings 322A and 322B can be formed. Then, the sacrificial layer 318 can be removed from the openings 312A/312B (shown in FIG. 3), and the sacrificial layer 308 can be removed from the openings 302A/302B (shown in FIG. 2). Consequently, the channel structures 107A and 107B can be formed within the left-side opening 341A and the right-side opening 341B.

In the FIG. 1A example, partially replacing the sacrificial layers 304 in the area 151 and the area 153 can take place at different times. For example, GLS openings corresponding to the GLSs 111 and 112 at the transition region 104 and the contact region 101 may first be covered, for example, by filling a sacrificial material or a lithography mask. Then, the sacrificial layers 304 in the area 151 can be replaced with a metal via GLS openings that are not covered in the area 151. In a next step, the sacrificial layers 304 in the area 153 can be replaced. Or, the above order can be reversed. For example, replacement of the sacrificial layers 304 in the area 153 can be performed before the replacement of the sacrificial layers 304 in the area 151. The GLS openings corresponding to the GLSs 111-113 can then be filled to form the GLSs 111-113. Thereafter, the word line contacts 171 can be formed in the contact region 101.

In another example, a staircase may have been formed in the contact region 101. When replacing the sacrificial layers 304, a whole sacrificial layer 304 of each step can be replaced via GLS openings corresponding to the GLSs 111/112/113.

At the current stage, after the above processing steps described with reference to FIGS. 2-7, the device 100 shown in FIG. 1A and FIG. 1B is formed.

When the staircase structure is used in the contact region 101, for either the one-etch GLS method or the multi-etch GLS method, the GLS etch crosses an oxide layer (for example, including SiO2) formed above the staircase structure in addition to the alternating sacrificial layers and insulating layers. The Etch of channel structures crosses the alternating sacrificial layers and insulating layers. Merging the GLS etch with the channel structure etch can be relatively difficult because the etch process involves the oxide material. In contrast, for the configuration without the staircase structure, the GLSs and the channel structures cross the same stacking layers. Thus, merging the formation of these two types of structures can be relatively more feasible.

In addition, for the particular word line contact design in the example of FIG. 1A, more chip areas can be yielded to the GLS structures. Thus, the GLS 111 in FIG. 1B can have a wider top size. A wider GLS opening makes it easier to fill the GLS opening and makes the GLS structure stronger to better support the structure of the device 100.

In some embodiments, instead of using a GLS, a source line contact is formed at the contact region 101 to provide a conductive contact path for the source line at the bottom of the device 100. Such a source line contact crosses the N decks of the device 100. In combination with such a configuration, the risk of dielectric breakdown caused by the discontinuity of the multi-etch (multi-segment) GLS can be avoided.

In addition, when a GLS is used to provide a source line contact path, a spacer layer (e.g., SiO2) is formed to isolate a conductive core (e.g., polysilicon) from surrounding word line layers. The spacer layer structure imposes limitations on the size and shape of a GLS opening. In combination with the source line contact being formed in the contact region 101, the size and/or shape requirement to the multi-etch (multi-segment) GLS can be relaxed. In some examples, without the limitations of the spacer structure, the bottom of a GLS can be formed narrower.

FIG. 8 is a flowchart of a fabrication process 800 for making a 3D NAND memory device, such as the device 100, according to embodiments of the disclosure. The process 800 can start from S801 and proceed to S810.

At S810, decks are formed stacked over a semiconductor layer in a vertical direction perpendicular to a working surface of the semiconductor layer. Each deck includes alternating word line layers and insulating layers. At S820, a gate line structure (GLS), which extends through the first layers and the second layers of the decks, is formed. A sidewall of the GLS is discontinuous at a border between two neighboring decks. The GLS includes a first GLS that includes a gate line slit, a second GLS that includes sub-GLSs spaced apart from each other in a horizontal direction, or a combination thereof. At S830, a channel structure, which extends through the first layers and the second layers of the decks, is formed. A sidewall of the channel structure is discontinuous at a border between two neighboring decks.

It should be noted that additional steps can be provided before, during, and after the process 800, and some of the steps described can be replaced, eliminated, or performed in a different order for additional embodiments of the process 800. In subsequent process steps, various additional interconnect structures (e.g., metallization layers having conductive lines and/or vias) or periphery structures may be formed over the 3D NAND memory device. The periphery structures can form control circuitry to operate the device 3D NAND memory device. The interconnect structures can electrically connect the 3D NAND memory device with the periphery structures or other contact structures and/or active devices to form functional circuits. Additional device features such as passivation layers, input/output structures, and the like may also be formed.

Figure 9:
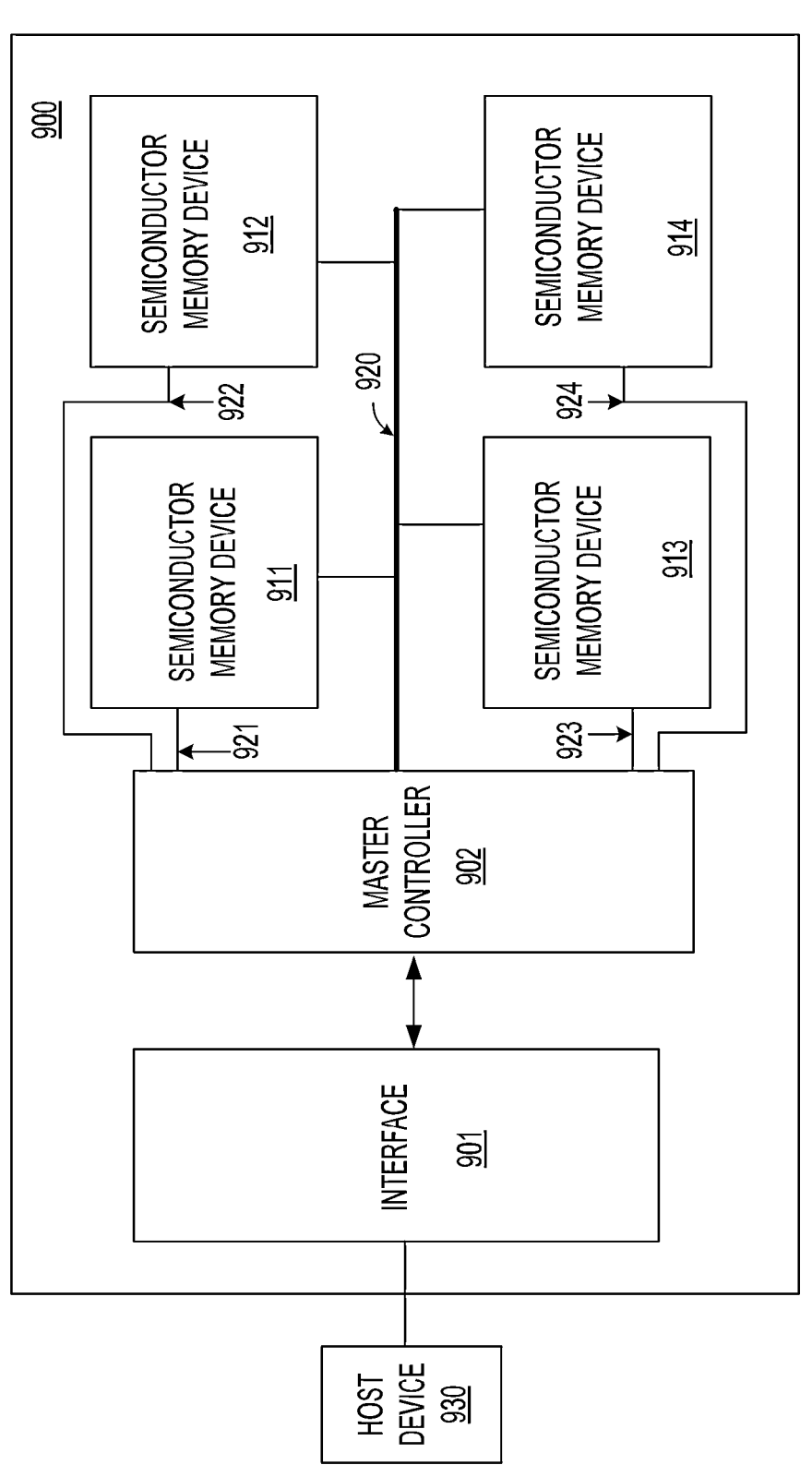
FIG. 9 shows a block diagram of a memory system device according to some examples of the disclosure.

FIG. 9 shows a block diagram of a memory system device 900 (also referred to as a memory system 900) according to some examples of the disclosure. The memory system device 900 includes one or more semiconductor memory devices 911-914, which can be similar to the device 100. In some examples, the memory system device 900 is a solid-state drive (SSD) or a memory module.

The memory system device 900 can include other suitable components. For example, the memory system device 900 includes an interface (or master interface circuitry) 901 and a master controller (or master control circuitry) 902 coupled together as shown in FIG. 9. The memory system device 900 can include a bus 920 that couples the master controller 902 with the semiconductor memory devices 911-914. In addition, the master controller 902 is connected with the semiconductor memory devices 911-914 through control lines 921-924.

The interface 901 is suitably configured mechanically and electrically to connect between the memory system device 900 and a host device 930. The interface 901 can be used to transfer data between the memory system device 900 and the host device 930.

The master controller 902 is configured to connect the respective semiconductor memory devices 911-914 to the interface 901 for data transfer. For example, the master controller 902 is configured to provide enable/disable signals respectively to the semiconductor memory devices 911-914 to activate one or more semiconductor memory devices 911-914 for data transfer.

The master controller 902 provides functions for the completion of various instructions within the memory system device 900. For example, the master controller 902 can perform bad block management, error checking and correction, garbage collection, and the like. In some embodiments, the master controller 902 is implemented using a processor chip. In some examples, the master controller 902 is implemented using multiple master control units (MCUs).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
decks stacked over a semiconductor layer in a vertical direction, each deck including alternating word line layers and insulating layers;
a gate line structure (GLS) extending through the word line layers and the insulating layers of the decks; and
a channel structure extending through the word line layers and the insulating layers of the decks,
wherein a sidewall of the GLS is discontinuous at a border between two neighboring decks, and a sidewall of the channel structure is discontinuous at an interface between two neighboring decks,
wherein the GLS comprises a first GLS that includes a gate line slit, a second GLS that includes sub-GLSs spaced apart from each other in a horizontal direction, or a combination thereof.

2. The semiconductor device of claim 1, wherein:
the GLS includes a first portion extending through a first deck, and a second portion extending through a second deck, and
a top surface of the first portion of the GLS is in direct contact with and positioned within a bottom surface of the second portion of the GLS.

3. The semiconductor device of claim 2, wherein:
a sidewall of the first portion of the GLS is spaced apart from a sidewall of the second portion of the GLS.

4. The semiconductor device of claim 2, wherein:
a sidewall of the first portion of the GLS and a sidewall of the second portion of the GLS are in direct contact with each other.

5. The semiconductor device of claim 1, wherein:
the channel structure includes a first portion extending through a first deck, and a second portion extending through a second deck, and a bottom surface of the second portion of the channel structure is in direct contact with and positioned within a top surface of the first portion of the channel structure.

6. The semiconductor device of claim 5, wherein:
the bottom surface of the second portion of the channel structure has a smaller circumference than the top surface of the first portion of the channel structure.

7. The semiconductor device of claim 1, wherein:
the GLS includes at least one gate line slit extending through one deck, and sub-GLSs extending through another deck and spaced apart from each other, and
the sub-GLSs are aligned with and in direct contact with the at least one gate line slit.

8. The semiconductor device of claim 7, wherein:
the sub-GLSs are positioned over or below the at least one gate line slit.

9. The semiconductor device of claim 1, wherein:
the first GLS comprises a block-partitioning GLS,
the second GLS comprises a finger-partitioning GLS, and
the block-partitioning GLS comprises a gate line slit with no gate line hole.

10. The semiconductor device of claim 9, wherein:
the finger-partitioning GLS comprises gate line holes.

11. A method of manufacturing a semiconductor device, the method comprising:
forming decks stacked over a semiconductor layer in a vertical direction, each deck including alternating first layers and second layers;
forming a gate line structure (GLS) extending through the first layers and the second layers of the decks, wherein a sidewall of the GLS is discontinuous at a border between two neighboring decks, and the GLS comprises a first GLS that includes a gate line slit, a second GLS that includes sub-GLSs spaced apart from each other in a horizontal direction, or a combination thereof; and
forming a channel structure extending through the first layers and the second layers of the decks, wherein a sidewall of the channel structure is discontinuous at an interface between two neighboring decks.

12. The method of claim 11, wherein the forming the decks comprises:
forming a first deck over the semiconductor layer;
forming a first channel opening and a first GLS opening in the first deck by a first etching process; and
filling the first channel opening and the first GLS opening with sacrificial material.

13. The method of claim 12, further comprising:
forming a second deck over the first deck;
forming a second channel opening and a second GLS opening in the second deck by a second etching process; and
filling the second channel opening and the second GLS opening with sacrificial material.

14. The method of claim 13, wherein:
a bottom surface of the second channel opening is in direct contact with and positioned within a top surface of the first channel opening, and
a top surface of the first GLS opening is in direct contact with and positioned within a bottom surface of the second GLS opening.

15. The method of claim 14, wherein:
the bottom surface of the second portion of the channel structure has a smaller circumference than the top surface of the first portion of the channel structure.

16. The method of claim 11, wherein the forming the decks comprises:

forming an uppermost deck of the decks over other decks of the decks; and forming an uppermost channel opening and an uppermost GLS opening in the uppermost deck by two separate etching processes.

17. The method of claim 16, wherein the forming the GLS comprises:

removing sacrificial material from other GLS openings in other decks after the uppermost GLS opening is formed; and filling the other GLS openings and the uppermost GLS opening with the GLS.

18. The method of claim 16, wherein the forming the channel structure comprises:

removing sacrificial material from other channel openings in other decks after the uppermost channel opening is formed; and filling the other channel openings and the uppermost channel opening with the channel structure.

19. The method of claim 11, wherein the forming the GLS comprises:

forming one GLS opening including holes and another GLS opening including a line slit, wherein the holes are aligned with and in direct contact with the line slit; and filling the holes and the line slit with the GLS.

20. A memory system, comprising:

a controller;

interface circuitry for connecting the controller to a host device; and a memory device connected to the controller, the memory device including:

decks stacked over a semiconductor layer in a vertical direction, each deck including alternating word line layers and insulating layers;

a gate line structure (GLS) extending through the word line layers and the insulating layers of the decks; and a channel structure extending through the word line layers and the insulating layers of the decks, wherein a sidewall of the GLS is discontinuous at a border between two neighboring decks, and a sidewall of the channel structure is discontinuous at an interface between two neighboring decks, wherein the GLS comprises a first GLS that includes a gate line slit, a second GLS that includes sub-GLSs spaced apart from each other in a horizontal direction or a combination thereof.

\* \* \* \* \*